United States Patent
Song et al.

(10) Patent No.: US 10,298,422 B1
(45) Date of Patent: May 21, 2019

(54) MULTI-PATH PEAKING TECHNIQUE FOR EQUALIZATION AND SUPPLY NOISE COMPENSATION

(71) Applicant: NVIDIA Corporation, Santa Clara, CA (US)

(72) Inventors: Sanquan Song, Mountain View, CA (US); Nikola Nedovic, San Jose, CA (US); John Michael Wilson, Wake Forest, NC (US); John W. Poulton, Chapel Hill, NC (US); Walker Joseph Turner, Durham, NC (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 15/862,517

(22) Filed: Jan. 4, 2018

(51) Int. Cl.
*H03F 1/26* (2006.01)
*H04B 3/06* (2006.01)
*H03F 3/193* (2006.01)
*H04L 25/03* (2006.01)
*H04L 25/08* (2006.01)

(52) U.S. Cl.
CPC .......... *H04L 25/03057* (2013.01); *H03F 1/26* (2013.01); *H03F 3/193* (2013.01); *H04B 3/06* (2013.01); *H04L 25/085* (2013.01); *H03F 2200/72* (2013.01); *H03F 2200/75* (2013.01)

(58) Field of Classification Search
CPC ........ H03F 3/45183; H03F 3/193; H03F 1/26; H03F 2200/72; H03F 2200/75; H04L 25/085; H04L 25/03057; H04B 3/06
See application file for complete search history.

(56) References Cited

U.S. PATENT DOCUMENTS

| | | | |
|---|---|---|---|
| 5,486,790 | A | 1/1996 | Huijsing et al. |
| 5,854,573 | A | 12/1998 | Chan |
| 6,084,475 | A | 7/2000 | Rincon-Mora |
| 6,150,884 | A | 11/2000 | Fattaruso |
| 6,304,131 | B1 | 10/2001 | Huggins et al. |
| 6,525,601 | B2 | 2/2003 | Gilbert |
| 6,573,791 | B2 | 6/2003 | Sridhar |
| 6,731,163 | B2 | 5/2004 | Huckins et al. |
| 6,930,554 | B2 | 8/2005 | Mondal et al. |
| 6,975,099 | B2 | 12/2005 | Wu et al. |
| 7,183,842 | B1 | 2/2007 | Wai et al. |

(Continued)

OTHER PUBLICATIONS

Yousry et al., "AC Boosting Compensation with Zero Cancellation for Multistage Amplifiers," Internatonal Conference on Microelectronics, Dec. 2007, pp. 1-4.

(Continued)

*Primary Examiner* — Sung S Ahn
(74) *Attorney, Agent, or Firm* — Leydig, Voit & Mayer, Ltd.

(57) ABSTRACT

A multi-stage amplifier circuit equalizes an input signal through multiple signal amplification paths. DC gain is kept substantially constant over frequency, while adjustable high-frequency gain provides equalization (e.g., peaking). Various embodiments include a common source topology, a common gate topology, differential signaling topologies, and a topology suitable for stabilizing a voltage supply against high-frequency transient loads. A system may include one or more integrated circuits that may each include one or more instances of the multi-stage amplifier.

20 Claims, 17 Drawing Sheets

(56) References Cited

U.S. PATENT DOCUMENTS

| | | | |
|---|---|---|---|
| 7,348,851 B2 | 3/2008 | Chen et al. | |
| 7,843,270 B2 | 11/2010 | Li et al. | |
| 7,973,605 B2 | 7/2011 | Dasgupta | |
| 8,493,092 B2 | 7/2013 | Rajaee et al. | |
| 8,963,639 B2 | 2/2015 | Yan et al. | |
| 2009/0295480 A1* | 12/2009 | Ikeda | H03F 1/223 330/253 |
| 2014/0117950 A1 | 5/2014 | Ng et al. | |
| 2014/0269890 A1* | 9/2014 | Hoang | H04L 25/03 375/233 |

OTHER PUBLICATIONS

Aminzadeh et al., "Low-Dropout Voltage Source: An Alternative Approach for Low-Dropout Voltage Regulators," IEEE Transactions on Circuits and Systems—II: Express Briefs, vol. 61, No. 6, Jun. 2014, pp. 413-417.

Schlarmann et al., "A New Multi-path Amplifier Design Technique for Enhancing Gain Without Sacrificing Bandwidth," Circuits and Systems, 1999, pp. II-610-II-615.

Eschauzier et al., "A 100-MHz 100-dB Operational Amplifier with Multipath Nested Miller Compensation Structure," IEEE Journal of Solid-State Circuits, Dec. 1992, vol. 27, No. 12, pp. 1709-1717.

Zaidi et al., "Rail-to-Rail Output Op-Amp Design with Negative Miller Capacitance Compensation," World Academy of Science, Engineering and Technology, International Journal of Electrical, Computer, Energetic, Electronic and Communication Engineering, 2017, vol. 11, No. 3, pp. 255-261.

Eschauzier et al., "An Operational Amplifier with Multipath Miller Zero Cancellation for RHP Zero Removal," Solid-State Circuits Conference, 1993. ESSCIRC'93, Nineteenth European. vol. 1. IEEE, 1993, pp. 122-125.

Aroca et al., "A 2.4-Vpp 60-Gb/s CMOS Driver With Digitally Variable Amplitude and Pre-Emphasis Control at Multiple Peaking Frequencies," IEEE Journal of Solid-State Circuits, vol. 46, Issue 10, Oct. 2011, pp. 2226-2239.

* cited by examiner

US 10,298,422 B1

MULTI-PATH PEAKING TECHNIQUE FOR EQUALIZATION AND SUPPLY NOISE COMPENSATION

FIELD OF THE INVENTION

The present invention relates to equalization and supply noise compensation, and more particularly to peaking circuits for equalization and supply noise compensation.

BACKGROUND

To fully enable modern applications, such as deep machine learning, interconnections between different dies within a package or different chips on a printed circuit board system need to transmit signals at rates of tens of gigabits per second per lane within an energy footprint of a picojoule per bit. The channel loss at such high frequencies introduces inter-symbol interference (ISI) that limits the communication speed and compensation techniques that are needed conventionally require more power.

When ground-referenced signaling is used, the channel loss may be mild for short connection lengths, however the electrostatic discharge (ESD) circuits and redistribution layer (RDL) interconnect routes present a large parasitic capacitance and degrade the bandwidth (BW) at both the transmitter and receiver ends of the connection. The resulting accumulated loss may be significant and require additional equalization capacity.

For the high-speed links of graphics processing unit (GPU) applications, the channel loss for transmitting one data set at 12.5 GHz is estimated to be 25.3 dB with severe supply noise. To transmit data over the channel at 25 Gbps with a reasonable bit error rate (usually $<10^{-12}$), all available equalization schemes, such as transmitter pre-emphasis, multi-stage receiver continuous time linear equalization (CTLE) and multi-tap receiver decision feedback equalizer (DFE), are required, increasing both design complexity and power consumption. There is a need for addressing these issues and/or other issues associated with the prior art.

SUMMARY

A circuit and system are disclosed for equalization and supply noise compensation. The circuit comprises a plurality of stages, an input signal coupled to the plurality of stages, and an output signal generated by the final stage in the plurality of stages. In one embodiment, each stage in the plurality of stages includes at least one metal oxide semiconductor field effect transistor (MOSFET), and an output of each stage in the plurality of stages excluding a final stage in the plurality of stages is coupled to an input of a subsequent stage in the plurality of stages. Furthermore, the input signal is coupled to at least one terminal of a first MOSFET in each stage. In one embodiment, a DC gain associated with a node at an output of each stage is constant over each of the nodes at the outputs of the plurality of stages, and an AC gain associated with the node at the output of each stage increases over each of the nodes at the outputs of the plurality of stages based on a number of stages in the plurality of stages that precede the node.

The system includes at least one instance of the circuit. The system may comprise a processing unit such as a graphics processing unit (GPU).

DETAILED DESCRIPTION

A receiver equalization technique that overcomes certain limitations in the prior art is disclosed herein. The receiver equalization technique provides greater equalization capability and larger peaking gain at higher peaking frequencies than conventional approaches.

The receiver equalization technique may be implemented in a multi-path receiver circuit to amplify an input signal using a gain that is a function of frequency. DC gain for the multi-path receiver circuit may be held constant regardless of the number of stages in the circuit, while the AC gain may be configured to accumulate as additional stages are added. In various embodiments, an input signal is shared among transistor inputs in different stages of the multi-path receiver circuit. For example, an input signal may be coupled to a source terminal of an NMOS transistor in a first circuit stage, while a drain terminal of the NMOS transistor functions as an output signal of the first stage. The drain terminal may be coupled to the gate terminal of the NMOS transistor through a feedback resistor. The output signal of the first stage is coupled to the gate terminal of an NMOS transistor in a second stage, and the source terminal of the NMOS transistor in the second stage is coupled to the same input signal as the NMOS transistor in the first stage. Furthermore, the drain terminal of the NMOS device functions as an output of the second stage. In other embodiments, the input signal may be coupled to the source terminals of different PMOS transistors in multiple stages. In such configurations, DC gain at different nodes between the plurality of chained stages remains substantially constant, while the AC gain compounds as more stages are chained together. Furthermore, a resulting pole and a resulting zero of the circuit will move further apart as additional stages are added to the multi-path receiver circuit.

Various embodiments of the presently disclosed circuit techniques can be utilized in a number of different applications. In one embodiment, a SerDes (Serializer/Deserializer) receiver circuit includes an instance of the presently disclosed multi-path circuit. In this context, the multi-path circuit is used to reduce inter-symbol interference on a high-speed serial link coupled to the receiver circuit.

Figure 1A:
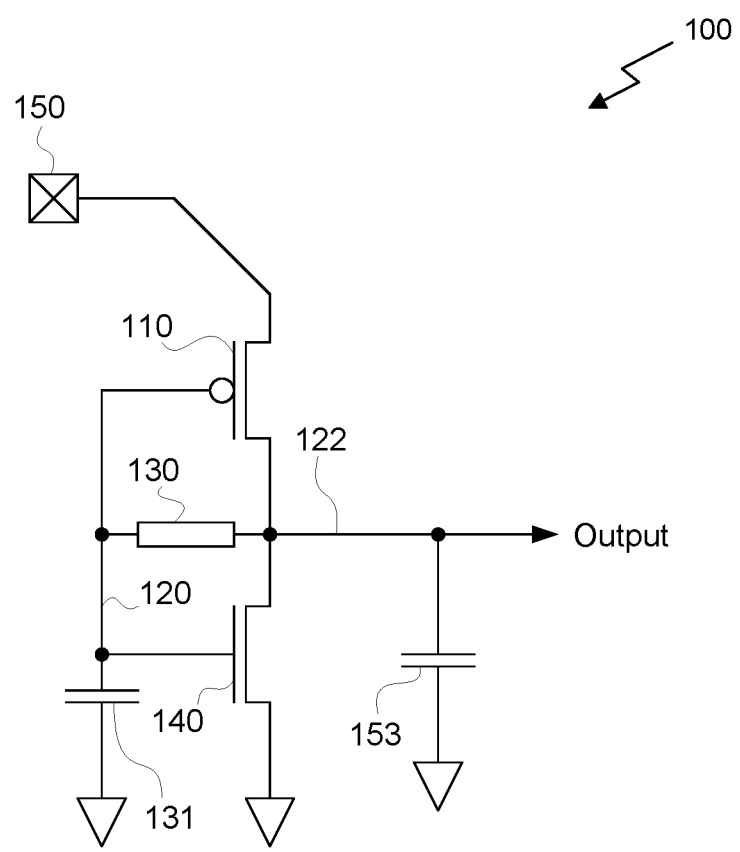
FIG. 1A illustrates a stage circuit of a multi-path receiver circuit, according to one embodiment.

FIG. 1A illustrates a stage circuit 100 of a multi-path receiver circuit, according to one embodiment. As shown, the stage circuit 100 includes PMOS transistor 110, NMOS transistor 140, and feedback resistor 130. The PMOS transistor 110 and NMOS transistor 140 form an inverter structure, with an inverter input node 120 and an inverter output node 122. A shunt capacitor 131 is coupled between the inverter input node 120 and ground, providing a shunt path to ground or between the PMOS and NMOS transistors. A load capacitor 153 is coupled between the inverter output node 122 and ground. A feedback resistor 130 is coupled between the inverter input node 120 and the inverter output node 122. An input signal 150 is injected at the source node of PMOS transistor 110.

In one embodiment, feedback resistor 130 has a resistance value of $R_{FB}$, shunt capacitor 131 has a value of $C_{FB}$, and PMOS transistor 110 has a transconductance value of $g_{m,p1}$. Furthermore, stage circuit 100 has a transfer function from input signal 150 to output node 122 with a zero at $1/R_{FB}C_{FB}$ and a pole at $g_{m,p1}/C_{FB}$. During normal operation, input signal 150 may operate close to a positive supply rail ($V_{DD}$), however a symmetrically constructed version of the stage circuit 100 will operate substantially identically with an input signal 150 referenced to ground instead. DC gain of stage circuit 100 can be fixed at 0.5. Furthermore, as additional stages of stage circuit 100 are stacked together to form a multi-stage circuit, the DC gain of the DC gain of the multi-stage circuit remains 0.5. This DC gain property of stage circuit 100 advantageously provides for different multi-stage amplifier (receiver) circuits to be constructed to have an arbitrarily engineered frequency response curve while preserving a constant DC gain.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 1B:
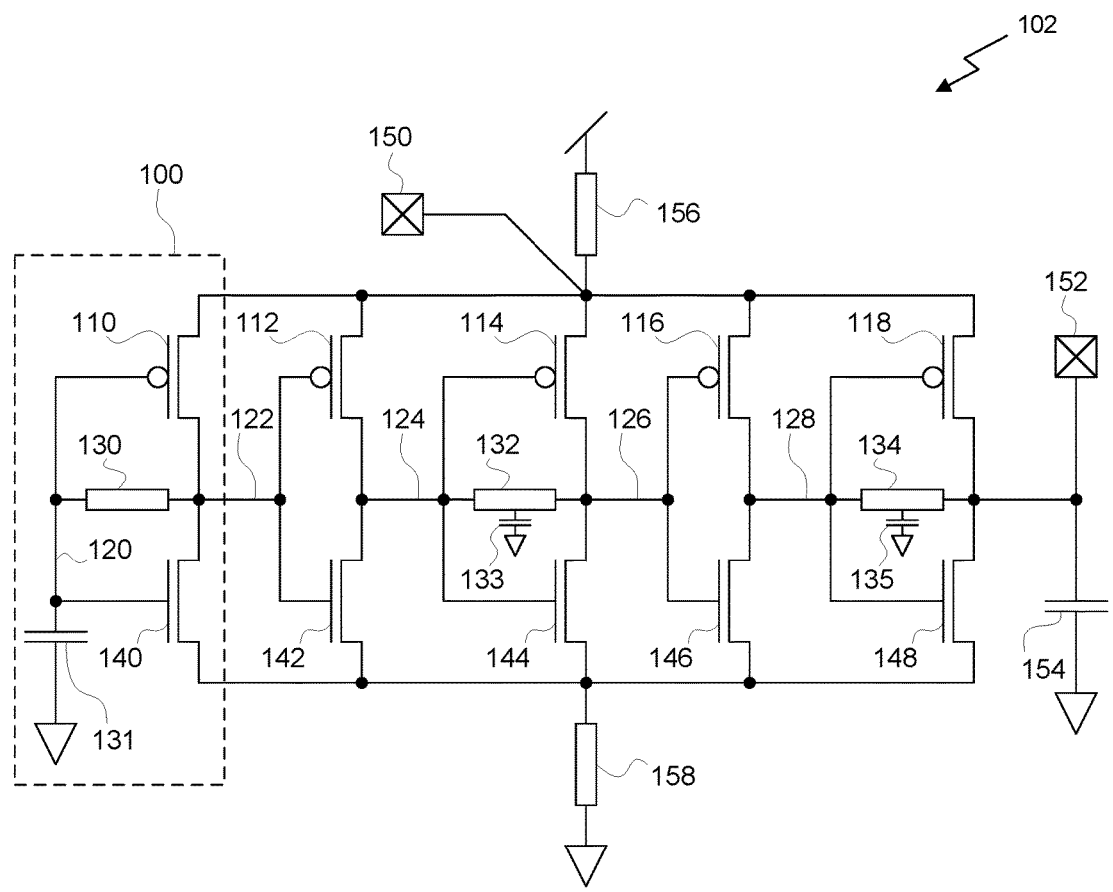
FIG. 1B illustrates a 5-stage implementation of a multi-path receiver circuit, according to one embodiment.

FIG. 1B illustrates a 5-stage implementation of a multi-path receiver circuit 102, according to one embodiment. As shown, the multi-path receiver circuit 102 includes stage circuit 100 (a first stage) and four additional stage circuits (five total stages). A second stage circuit includes PMOS transistor 112 and NMOS transistor 142 with node 122 serving as an input and node 124 serving as an output. A third stage circuit includes PMOS transistor 114, NMOS transistor 144, and feedback resistor 132, with node 124 serving as an input and node 126 serving as an output. The third stage circuit may include shunt capacitor 133. A fourth stage circuit includes PMOS transistor 116 and NMOS transistor 146, with node 126 serving as an input and node 128 serving as an output. A fifth stage circuit includes PMOS transistor 118, NMOS transistor 148, and feedback resistor 134, with node 128 serving as an input and output node 152 serving as an overall output for multi-path receiver circuit 102. Input signal 150 is injected at the source node of PMOS transistors 110, 112, 114, 116, and 118. In this way, input signal 150 is injected into each of the five stages. As shown, each of the five stages, including three instances of the stage circuit 100, receives the input signal 150. Furthermore, outputs of the first through fourth stages serve as inputs to the second through fifth stages, respectively. Each of the five stages may be configured to move the resulting pole and the zero, and/or provide additional peaking at a selected frequency. A load capacitor 154 may have a load capacitance of $C_{LOAD}$. Resistor 156 provides supply-referenced input termination.

Figure 1C:
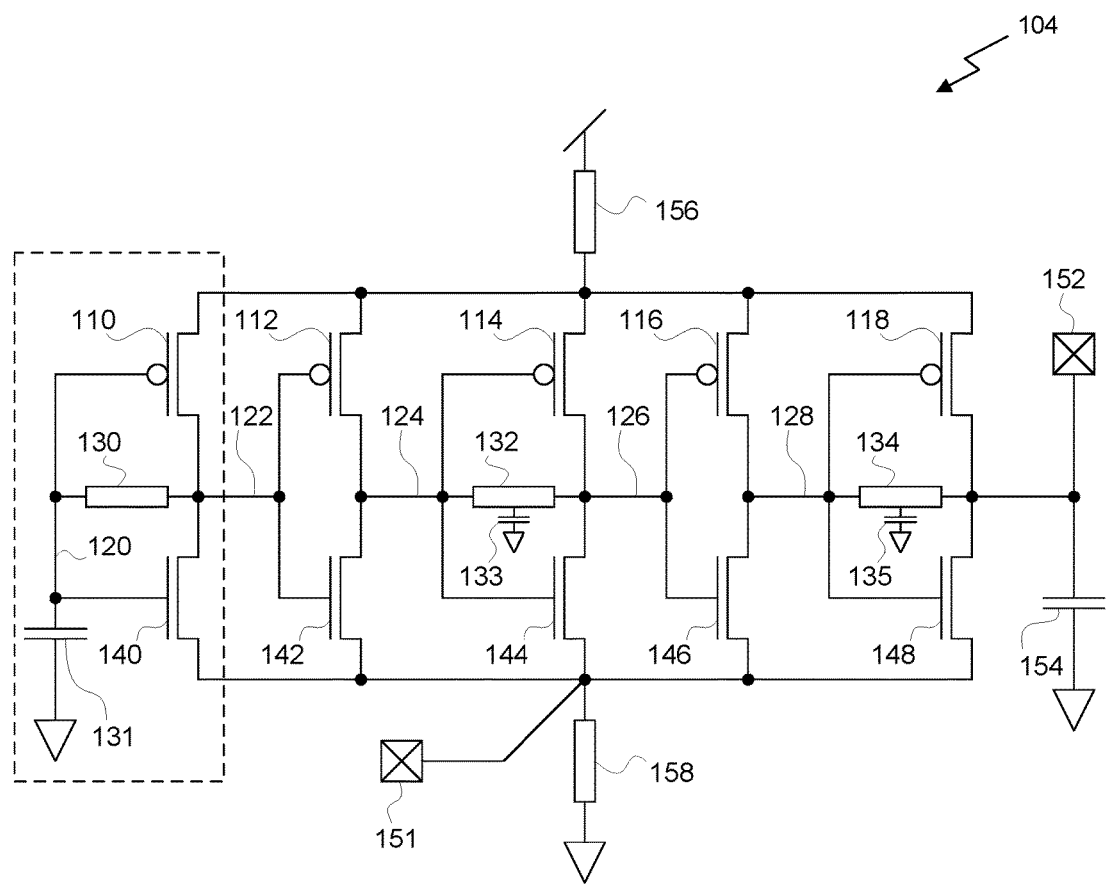
FIG. 1C illustrates a 5-stage implementation of a multi-path receiver circuit, according to one embodiment.

FIG. 1C illustrates another 5-stage implementation of a multi-path receiver circuit 104, according to one embodiment. Multi-path receiver circuit 104 is symmetrically constructed according to multi-path receiver circuit 102, with differences introduced to provide for near-ground input operation and signal termination. Specifically, an input signal 151 is coupled to one or more of source nodes of NMOS transistors 140, 142, 144, 146, and 148 (rather than PMOS transistors 110-118), and termination resistor 158 provides ground-referenced termination of input signal 151. These features provide near-ground input operation.

Multi-path receiver circuit 104 includes five stages, with each stage comprising a CMOS inverter structure (e.g., PMOS transistor 110 and NMOS transistor 140) and an optional feedback structure. Each odd stage of the circuit includes a feedback structure (e.g., feedback resistor 130, shunt capacitor 131) in the form of a feedback resistor that couples the output of the inverter structure within the odd stage to the input of the inverter structure. Additionally a shunt capacitor couples the feedback signal to ground. The input signal 151 is coupled to a source terminal of an NMOS transistor included in the inverter structure of each stage.

As shown, node 122 at the output of the first stage is associated with a DC gain of 0.5 due to the resistive feedback and an AC gain of $g_{m,N1}R_{FB}$. Transconductance of NMOS transistor 140 is indicated here as $g_{m,N1}$. There is one pole at $1/g_{m,N1}C_{FB}$ and one zero at $1/R_{FB}C_{FB}$. Node 124 at the output of the second stage is associated with a DC gain of, again, 0.5 by design and an AC gain of $-(g_{m,N1}R_{FB}g_{m,P2}+(g_{m,N1}R_{FB}-1)g_{m,N2})Z_2$, where $Z_2$ is the effective impedance at node 124. Transconductance of PMOS transistor 112 is indicated herein as $g_{m,P2}$, and transconductance of NMOS transistor 142 is indicated herein as $g_{m,N2}$. The impedance is determined mainly by the miller effect resistor (i.e., the feedback resistor 132 in stage 3) coupled to the output of node 124. Assuming $g_{m,N1}R_{FB} \gg 1$, the gain can be approximated as: $-g_{m,N1}R_{FB}(g_{m,P2}+g_{m,N2})|Z_2|$. Thus, the DC gain remains the same while the AC gain from each stage is accumulated. There is a right half plane (RHP) zero located at $1/R_{FB}C_{FB}(g_{m,P2}+g_{m,N2})|Z_2|$, and the dominant pole stays at $1/g_{m,N1}C_{FB}$. Node 126 at the output of the third stage is associated with a DC gain of 0.5 and an AC gain of $g_{m,N1}R_{FB}(g_{m,P2}+g_{m,N2})|Z_2|(g_{m,P3}+g_{m,N3})|Z_3|$, where $Z_3$ is the effective impedance at node 126. Transconductance of PMOS transistor 114 is indicated herein as $g_{m,P3}$, and transconductance of NMOS transistor 144 is indicated herein as $g_{m,N3}$. There is a left half plane (LHP) zero located at $1/R_{FB}C_{FB}(g_{m,P2}+g_{m,N2})|Z_2|(g_{m,P3}+g_{m,N3})|Z_3|$. However, pole locations are difficult to solve analytically. Simulation data has shown that the pole location stays nearly the same as the first stage and second stage; e.g., a pole is located at approximately $1/g_{m,N1}C_{FB}$. Consequently, the pole and zero location are widely separated, even at the third stage. For highly lossy channels, or for an even higher data rate of the serial link, additional stages can be included in the circuit, such as the 5-stage design shown. The fourth stage and the fifth stage are similar to the second stage and third stage, respectively. Again, the DC gain at the output of each stage remains constant at 0.5, but the AC gain scales with the number of stages.

In a conventional high-speed serial link, a collection of prior art equalizing schemes may need to be employed in order to equalize the signal at high transfer rates (e.g., 25 Gbps or more). The prior art techniques may include pre-emphasis at the transmitter, multi-stage continuous time linear equalization (CTLE) at the receiver, multi-tap decision feedback equalization (DFE) at the receiver, etc. However, circuit simulations indicate that even a 3-stage implementation of a multi-path receiver circuit may provide sufficient equalization to perform competitively with prior art techniques, but with a far less complex circuit design at the receiver. Additional circuit stages can be added, such as by increasing the number of stages from 3 stages to 5 stages or even 7 stages, to further increase the transfer rate (e.g., 31 Gbps). Even though the peaking frequency of the signal may shift from higher frequency to lower frequency by increasing the number of stages, the zero will shift even more dramatically from high frequency to lower frequency, meaning the pole over zero ratio is dramatically improved. The zeros associated with nodes from stages with feedback (e.g., odd numbered stages in the present example) may be used to equalize the channel loss. The right half plane zero introduces negative pre-cursor, which can be extracted from the output signal for pre-cursor cancellation.

Multi-path receiver circuits 102, 104 illustrate two key design principles. First, the multi-path receiver circuits 102, 104 employ an inverter structure, which effectively doubles transconductance relative to current mode logic (CML) structures. Doubling transconductance can provide either 6 dB of additional peaking gain or a doubling of peaking frequency. Second, the multi-path structure provides a wider separation between zero and pole, providing greater equalization ability. These design principles can be extended to differential signaling.

Figure 1D:
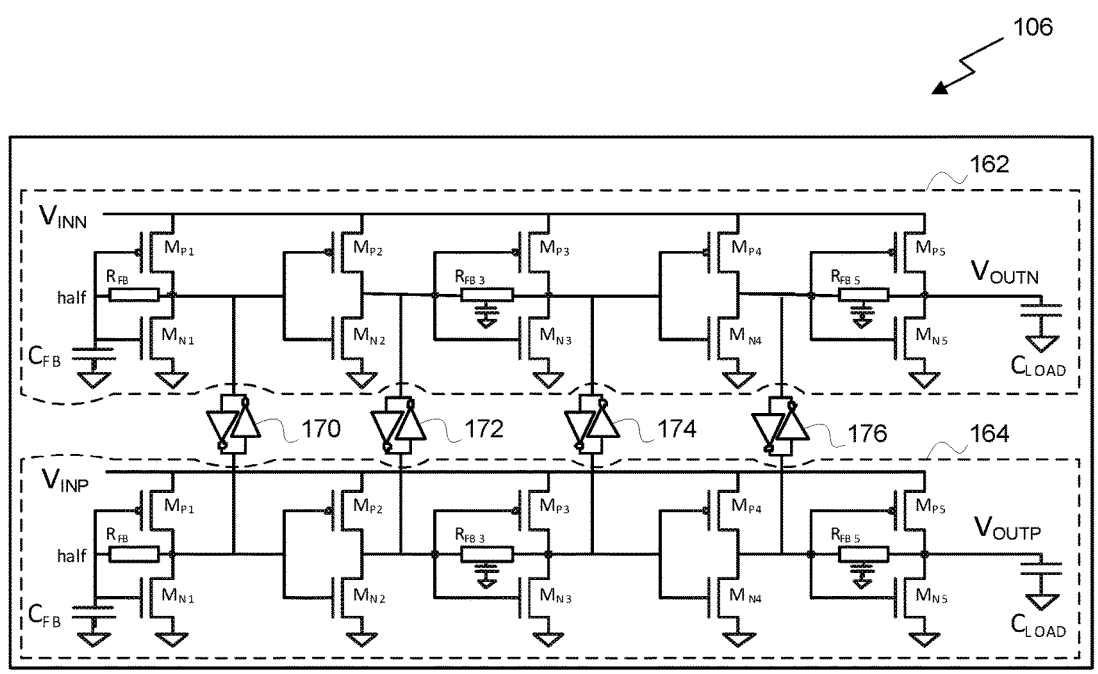
FIG. 1D illustrates a 5-stage implementation of a differential multi-path receiver circuit, according to one embodiment.

FIG. 1D illustrates a 5-stage implementation of a differential multi-path receiver circuit 106, according to one embodiment. The techniques described in FIGS. 1A-1C can be extended to differential signaling. As shown, an instance of a multi-path receiver circuit (e.g., multi-path receiver circuit 102) can be implemented for each input signal of a differential signal pair (i.e., $V_{INN}$ and $V_{INP}$), and the outputs of each corresponding stage of the two instances 162, 164 are connected via cross-coupled inverters 170, 172, 174, 176. In one embodiment, each signal in the differential signal pair is coupled to the source nodes of PMOS transistors in each stage of one of the corresponding two instances 162, 164. Differential output signals (i.e., $V_{OUTN}$ and $V_{OUTP}$) of the differential multi-path receiver circuit 106 are shown here transmitting resulting output signals to corresponding capacitive loads $C_{LOAD}$. In practice, the differential output signals would be coupled to circuitry configured to further process associated data.

Simulation Results

Figure 2A:
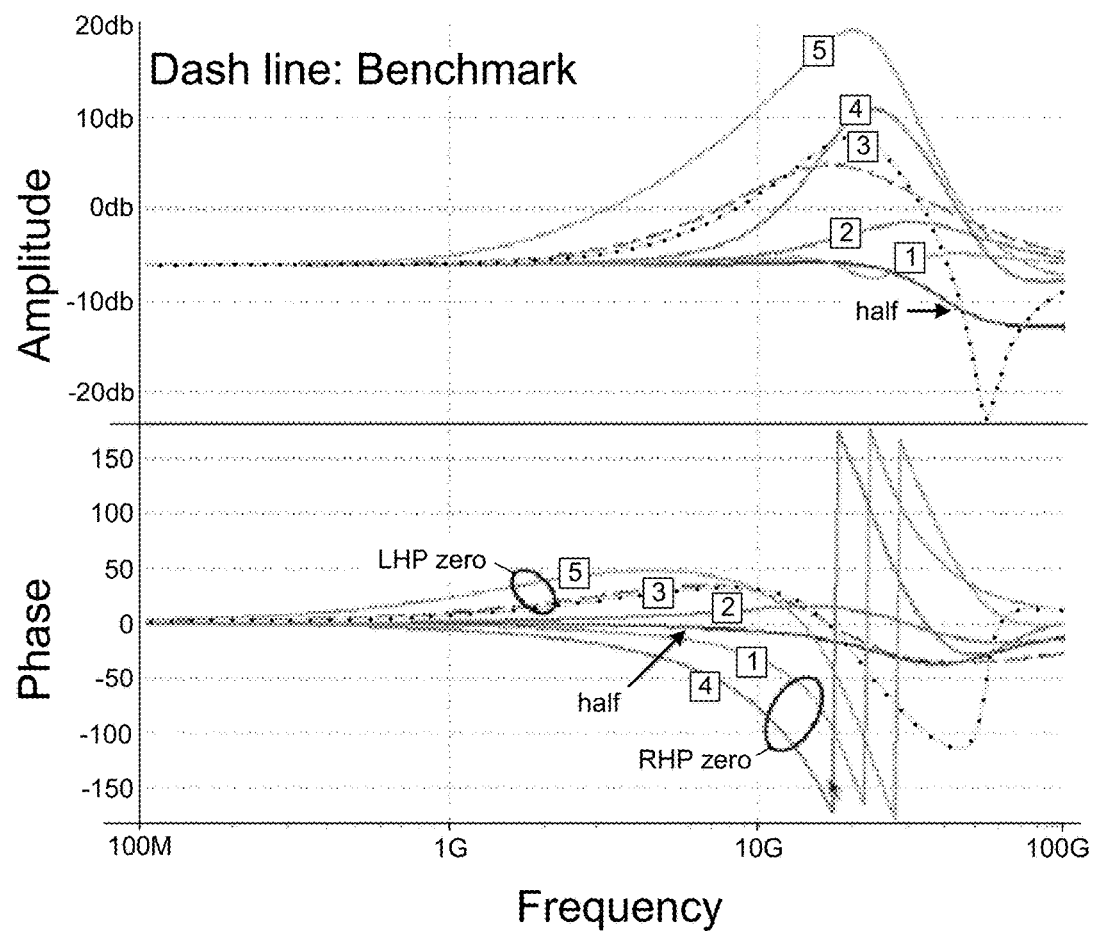
FIG. 2A illustrates amplitude and phase response curves for an exemplary receiver circuit, according to one embodiment.

FIG. 2A illustrates amplitude and phase response curves for an exemplary receiver circuit (multi-path receiver circuit 104 of FIG. 1C), according to one embodiment. The curves are marked 1 through 5, corresponding to nodes 122, 124, 126, 128, 152, respectively. For comparison, a one-stage circuit with the same power consumption and the same loading is simulated in parallel and referred to herein as a "benchmark" circuit, with results shown using a dash line. The proposed multi-path receiver circuit 104 increases peaking gain by 10+ dB and peaking frequency by 1.2×.

As shown, DC gain is constant at −6 dB across all the nodes. At high frequency, there is a really minor 4 dB peaking at node 122. Some AC attenuation can be observed at node 124 due to the second stage the gate voltage being in phase with the NMOS source voltage. At the third stage about 15 dB of peaking is reflected at node 126 because the gate voltage is in an opposing phase relative to the NMOS source voltage. The feedback resistor $R_{FB3}$ and shunt capacitor $C_{MID3}$ contribute to the peaking by about 2 to 4 dB. Further peaking can be observed at node 128. At node 152, the total peaking gain is about 26 dB with the peaking frequency around 22 GHz.

From node 122 to node 152, the zero has been shifted dramatically from 20 GHz to 2 GHz. However, the peaking frequency shifted only from 32 GHz to 22 GHz. Therefore, the pole over zero ratio has been improved by 6.9× through the serial stages. Reading the phase curves, it is obvious to those of ordinary skill in the art that the zeros with nodes 124 and 128 are located on the right half plane while the zeros while nodes 122, 126, 152 are on the left half plane. Since the channel poles are on the right half plane (due to RC properties), the zeros with nodes 122, 126, 152 can be applied to equalize the channel loss. The right half zero introduces a negative pre-cursor, which could be extracted for pre-cursor cancellation.

Figure 2B:
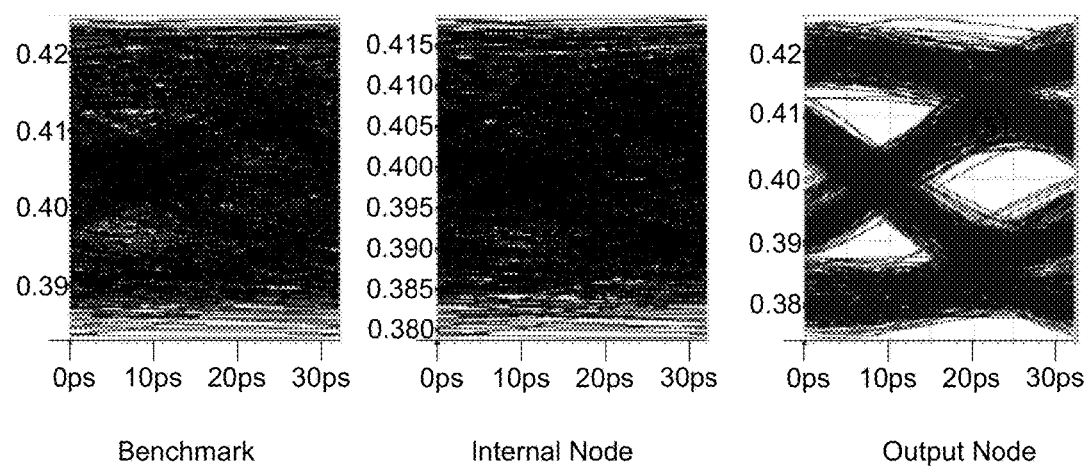
FIG. 2B illustrates eye diagrams for benchmark and compensated signaling, according to one embodiment.

FIG. 2B illustrates eye diagrams for benchmark and compensated signaling, according to one embodiment. As shown, the signal eye is essentially closed for the benchmark circuit. The signal eye at the internal node (node 126 of multi-path receiver circuit 104) is also substantially closed. However, the signal eye at the output node (node 152) is open due to compensation provided by the multi-path receiver circuit 104, illustrating the significant equalization capability of the multi-path receiver circuit 104.

Figure 2C:
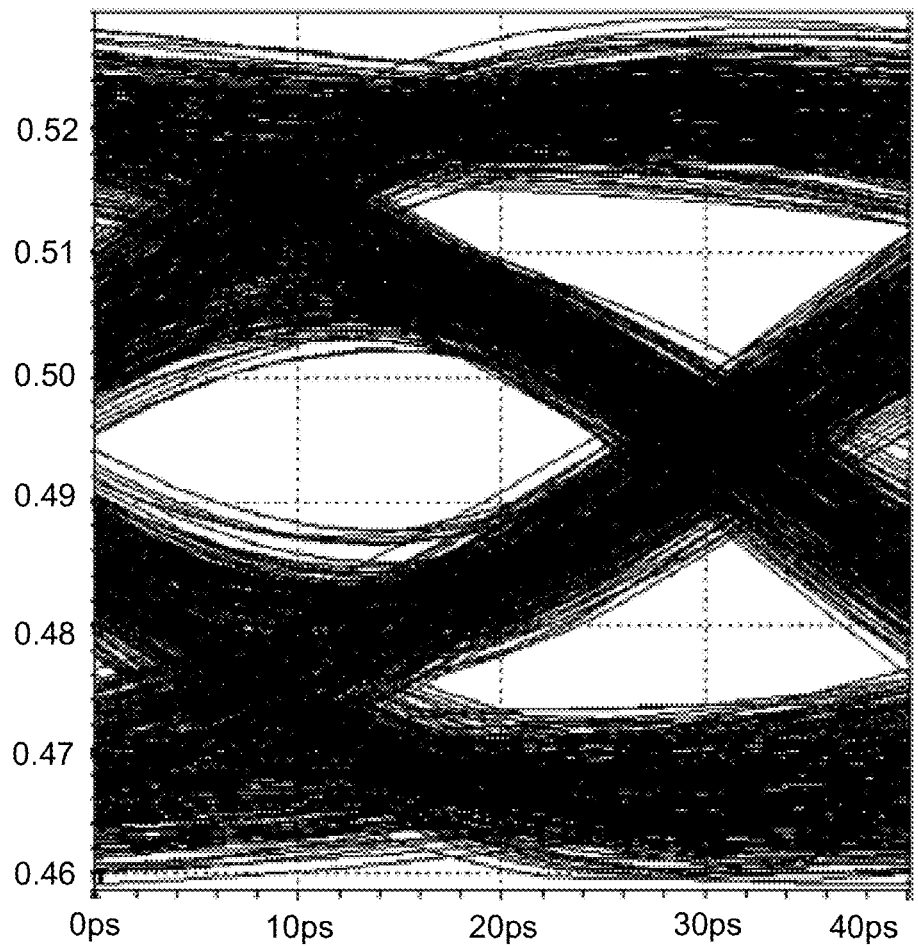
FIG. 2C illustrates an eye diagram for a three stage compensated signaling circuit, according to one embodiment.

FIG. 2C illustrates an eye diagram for a three stage compensated signaling circuit, according to one embodiment. The signal eye at the internal node (node 126 of multi-path receiver circuit 104) is open when the frequency is reduced to 25 Gbps compared with the same channel operating at 31.25 Gbps, as shown in FIG. 2B.

Differential Common Gate Receiver Circuits

Figure 3:
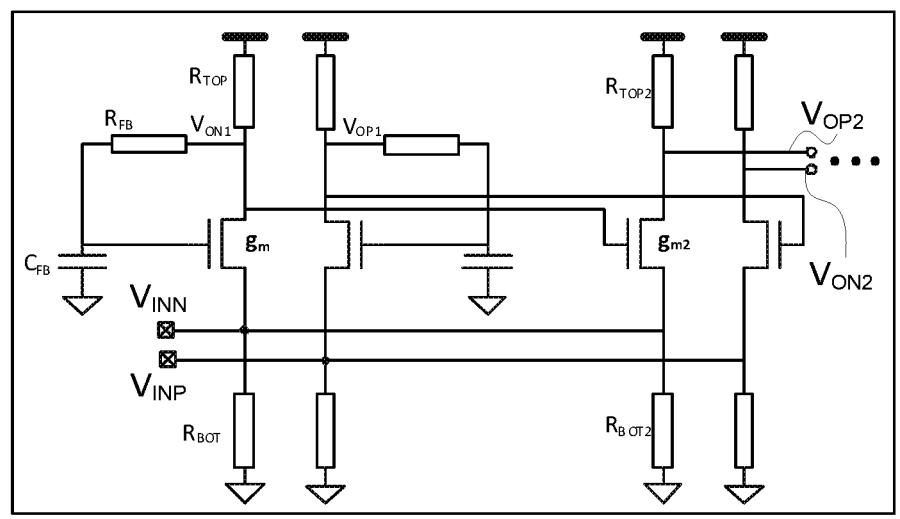
FIG. 3 illustrates a differential common gate receiver circuit, according to one embodiment.

FIG. 3 illustrates a differential common gate (CG) receiver circuit 300, according to one embodiment. As shown, the technique of building a multi-path receiver circuit can be extended to a common gate amplifier (CG receiver).

In a CG amplifier, the gate of an NMOS transistor is coupled to ground and the voltage input is coupled to the NMOS source. The voltage output is generated at the NMOS drain, which is coupled to a current source, such as $V_{DD}$, through a pull-up resistor (e.g., $R_{TOP}$). A two-stage CG amplifier can be implemented that shares the voltage input between two stages of the amplifier. The CG amplifier 300 represents a differential signal amplifier, although a single signal amplifier can be constructed utilizing one half of the CG amplifier 300.

In one embodiment, a first stage of the CG amplifier 300 includes a pair of NMOS transistors, with the differential input signal ($V_{INN}$ and $V_{INP}$) coupled to the sources of the pair of NMOS transistors. Outputs of the first stage (i.e., the drains of the NMOS transistors) are coupled to the gates of the corresponding NMOS transistors through the feedback resistors, and a pair of shunt capacitors is configured to couple the gates of the NMOS transistors to ground.

The outputs of the first stage are coupled to the gates of a second pair of NMOS transistors in the second stage. The voltage inputs coupled to the NMOS transistors in the first stage are also coupled to the sources of the second pair of NMOS transistors in the second stage. The gates of the second pair of NMOS transistors are coupled to the outputs of the first stage. The drains of the second pair of NMOS transistors are the outputs ($V_{OP2}$ and $V_{ON2}$) of the CG amplifier. Depending on the parameters of the components of the CG amplifier, extra stages sharing the differential voltage inputs could be added to shift the zero from the RHP to LHP and improve the peaking gain of the CG amplifier.

Figure 4:
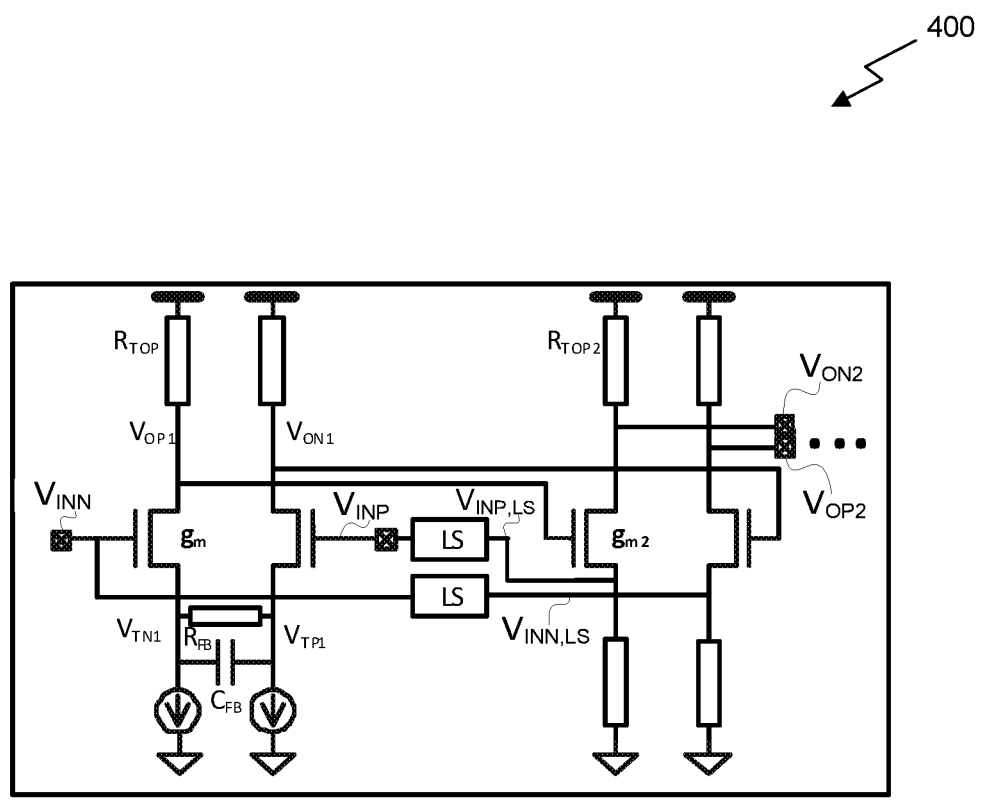
FIG. 4 illustrates a differential common source receiver circuit, according to one embodiment.

FIG. 4 illustrates a differential common source (CS) receiver circuit 400, according to one embodiment. As shown, the technique of building a multi-path receiver circuit can be extended to a common source amplifier (CS receiver).

In a CS amplifier, the source of an NMOS transistor is coupled to ground and a voltage input is coupled to the NMOS gate. An output voltage is coupled to the NMOS drain, which is tied to a current source, such as $V_{DD}$, through a pull-up resistor (e.g., $R_{TOP}$). A two-stage CS amplifier can be implemented that shares the voltage input between two stages of the amplifier.

In one embodiment, a first stage of the CS amplifier includes a pair of NMOS transistors, with the differential input signal coupled to the gates of the pair of NMOS transistors. A feedback resistor and a capacitor are connected between the source terminals of the two NMOS transistors. The source terminals are coupled to ground through respective current sources. The output of the first stage is fed into the second stage by the gate terminals of a second pair of NMOS transistors. The differential input signal is shared with the second stage by the source terminals of the second pair of NMOS transistors after being level shifted (LS). The main purpose of feeding the differential input signal to the second stage through the source terminals is to limit the overall DC gain.

Depending on parameters of the circuit components, the zero of the second stage could be on LHP or RHP. If the resulting zero of a two stage embodiment is located on the RHP, an extra stage may be added to shift the zero back to the LHP for equalization, which naturally brings more peaking gain.

Figure 5:
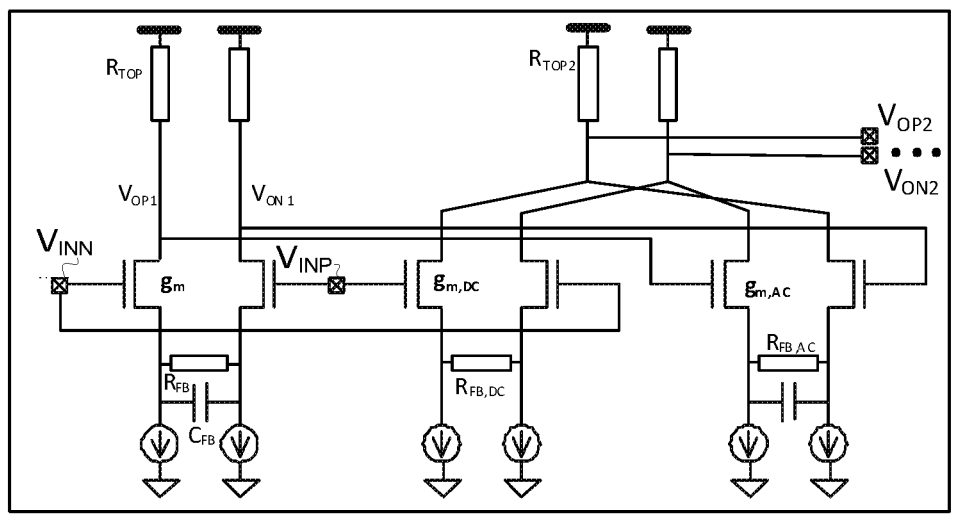
FIG. 5 illustrates a differential common source receiver circuit, according to one embodiment.

FIG. 5 illustrates a differential common source (CS) receiver circuit 500, according to one embodiment. CS receiver circuit 500 illustrates another possibility for implementing a CS amplifier that includes the same first stage as described with respect to differential CS receiver circuit 400. However, the second stage is split into two branches, with each branch including a pair of NMOS transistors. Currents from the two branches are subtracted at the output nodes at the drains of the NMOS transistors. The differential input signal ($V_{INN}$, $V_{INP}$) is connected to the gate terminals of a pair of NMOS transistors in a first branch, and the outputs ($V_{ON1}$, $V_{OP1}$) of the first stage are connected to the gate terminals of the pair of NMOS transistors in a second branch. The drain terminals for corresponding pairs of NMOS transistors in the first branch and the second branch are coupled together as the output of the CS amplifier ($V_{ON1}$, $V_{OP1}$). A feedback resistor is coupled between the source terminals of the NMOS transistors in the first branch of the second stage, and a feedback resistor and a feedback capacitor are coupled between the source terminals of the NMOS transistors in the second branch of the second stage. In one embodiment, DC gain is controlled by a first feedback resistor ($R_{FB,DC}$) and AC gain (e.g., peaking gain) is controlled by a second feedback resistor ($R_{FB,AC}$).

A multi-path inverter-based peaking amplifier is disclosed herein for use as an input receiver circuit for a Serializer/Deserializer (SerDes). The input receiver circuit includes multiple instances of an inverter structure. The NMOS source nodes of the inverter structures are shared as an input. Furthermore, alternating inverter structures may be configured to include a feedback structure comprising a feedback resistor and shunt capacitor.

In one embodiment, DC gain is maintained at 0.5 for all intermediate nodes of the input receiver, while AC gain multiplies after each stage. This multi-stage approach for engineering AC gain demonstrates significantly higher peaking gain and higher peaking frequency compared with conventional circuit topologies for substantially the same power consumption. Furthermore, design principles disclosed herein for single-ended input receivers can be extended to differential signaling and differential receivers, including CG and CS topologies.

Supply Noise Cancellation for a Low-Dropout Voltage Regulator

Figure 6A:
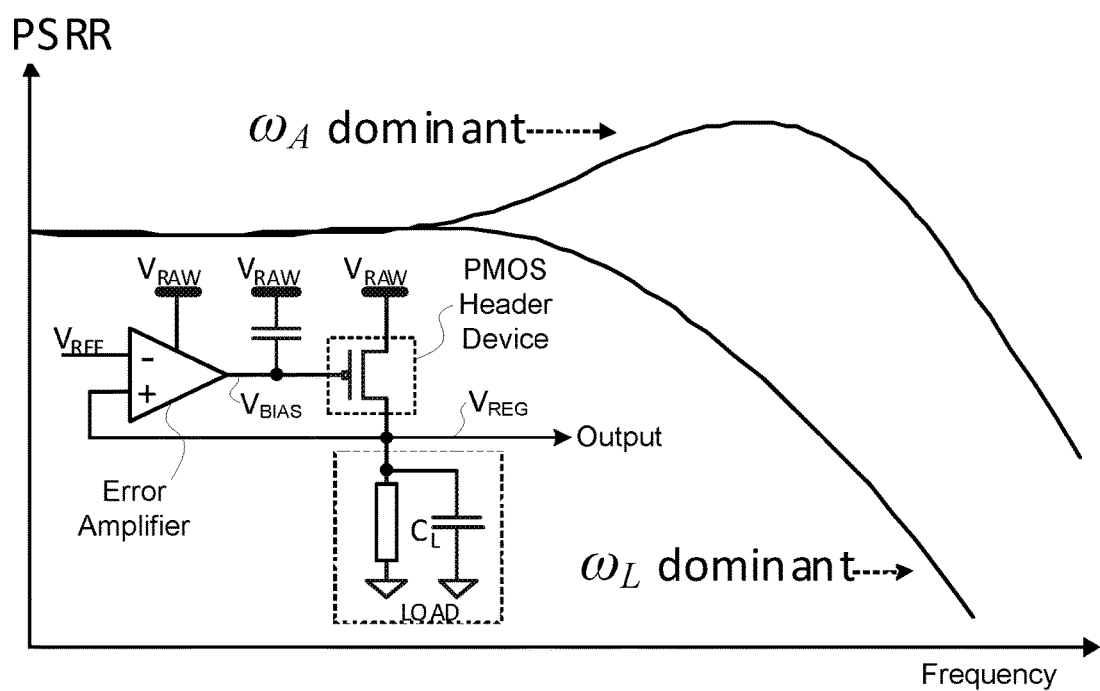
FIG. 6A illustrates a conventional low dropout (LDO) regulator along with typical power supply noise rejection ratio (PSRR) characteristics.

FIG. 6A illustrates a conventional low dropout (LDO) regulator along with typical power supply noise rejection ratio (PSRR) characteristics. Integrated LDO regulators perform a key function in modern integrated circuits and semiconductor systems, providing multiple voltage domains for different circuit blocks within the same die. In many integrated circuit designs, integrated LDO regulators are critical to maintaining operation at a reasonably low overall power consumption level. In many design scenarios, a quiet supply domain is needed for noise sensitive circuitries, such as high-speed I/O drivers and receivers. Therefore, the power supply noise rejection ratio of an LDO regulator is one key performance metric for the LDO regulator. In many cases, conventional LDO regulators provide inadequate PSRR performance at high frequencies (e.g., multiple GHz range).

As shown, the conventional LDO regulator includes an error amplifier (e.g., a comparator) configured to compare a regulated output voltage (at node $V_{REG}$) with a reference input voltage (at node $V_{REF}$). The error amplifier generates a bias voltage (at node $V_{BIAS}$) to control a PMOS header device for regulating the output voltage. This LDO regulator design operates according to two poles, $\omega_A$ and $\omega_L$, which characterize frequency response behavior at the output node of the error amplifier ($V_{BIAS}$) and the output node of the LDO ($V_{REG}$), respectively. To stabilize the system, these two poles must be far apart. (e.g., either $\omega_L \ll \omega_A$ or $\omega_A \ll \omega_L$). When $\omega_L \ll \omega_A$ ($\omega_A$ dominant) the supply noise below $\omega_L$ is cancelled by the regulator loop, and the supply noise above $\omega_L$ is filtered out directly by the load $R_L C_L$, resulting in good supply noise rejection performance across wide frequency range (as conventionally expected). However, for some applications, it is impractical to keep $\omega_L$ well below $\omega_A$ as doing so may require such a large capacitance value for $C_L$ that only an external capacitor can actually provide enough capacitance, leading to extra design effort and potentially significant cost. In such applications, the only conventional choice is to set $\omega_A$ as the dominant pole and exacerbate noise rejection performance in middle band frequencies. As shown in 6A, the LDO loop cancels supply noise having frequency components lower than $\omega_A$, while the load $R_L C_L$ cancels supply noise having frequency components higher than $\omega_L$, leaving the noise between $\omega_A$ and $\omega_L$ uncompensated.

A feed forward technique has been proposed in the prior to improve supply noise rejection performance. The technique introduces an additional high-pass path from a raw supply voltage node ($V_{RAW}$) to the regulated output voltage node ($V_{REG}$) to cancel supply noise within the bandwidth of feed forward path (e.g., $\omega_A$ to $\omega_L$). However, the feed forward gain must match a noise coupling path to avoid under or over compensation. Gain adaptation to provide such matching has been proposed recently; however, this technique suffers from system complexity and sensitivity of the adaptation loop itself.

Embodiments of the present disclosure overcome these problems in the prior art without introducing significant circuit complexity or difficult noise matching requirements. Embodiments of the present disclosure improve the supply noise rejection performance of a conventional LDO circuit by sensing noise from a regulated voltage node and feeding the sensed noise back to an additional power header for noise compensation. Furthermore, techniques disclosed herein for input receiver applications can be applied in this context to generating a feedback control signal for the power header to control the noise compensation. Specifically, circuit techniques disclosed herein provide: (1) peaking to sense mid and high frequency supply noise, (2) low DC gain to avoid disturbing the LDO feedback loop, (3) circuit simplicity, and (4) compatibility with more advanced processes technologies.

Figure 6B:
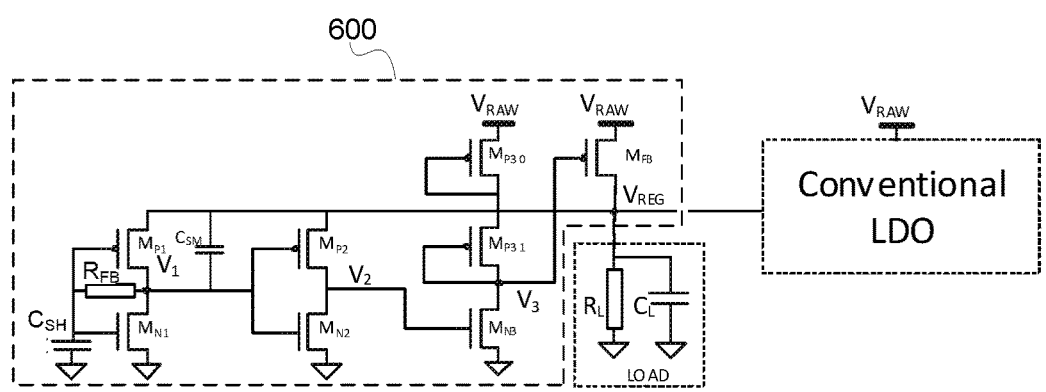
FIG. 6B illustrates a supply noise compensation circuit, according to one embodiment.

FIG. 6B illustrates a supply noise compensation circuit 600, according to one embodiment. The supply noise compensation circuit 600 may be configured to operate in conjunction with a low-dropout (LDO) regulator, or any other technically feasible voltage regulator circuit. In one embodiment, a regulated supply node (e.g., $V_{REG}$) is coupled to an output of a conventional LDO, the supply noise cancellation circuit 600, and a load. As shown, the load may comprise a DC load component ($R_L$) and an AC or capacitive load component ($C_L$). Both the LDO and the supply noise compensation circuit 600 are fed by an arbitrary supply rail ($V_{RAW}$).

The output of the LDO (regulated voltage, $V_{REG}$) may be coupled to multiple stages of the supply noise cancellation circuit 600. In one embodiment, the regulated supply node ($V_{REG}$) is coupled to the source terminals of PMOS transistors comprising two or more stages of the supply noise cancellation circuit 600. In one embodiment, a first stage utilizes an inverter with a feedback resistor ($R_{FB}$) coupled between the input and output ($V_1$) of the first stage (inverter). Additionally, a shunt capacitor ($C_{SH}$) ties the input of the inverter to ground. The output of the first stage ($V_1$) of the circuit has a DC gain of 0.5 and an AC gain of $g_m R_{FB}$. Circuit parameter $g_m$ specifies transconductance for PMOS transistor $M_{P1}$. An additional coupling capacitor ($C_{SM}$) is connected between $V_{reg}$ and $V_1$ to ensure that the gain of the first stage converges to 1 as frequency increases. In one embodiment, circuit parameters are selected such that $2/g_m > R_{FB}$ so that the high frequency noise on $V_{REG}$ is amplified for feedback purposes.

The output of the first stage is connected to the input of the second stage (i.e., the gate terminals of the second inverter). The DC gain at the second node is 0.5, while the AC gain is much greater due to the influence of the output of the first stage. The output ($V_2$) of the second stage is then passed through a level shifter (i.e., $M_{P30}$, $M_{P31}$, and $M_{N3}$), which generates the control voltage for a header device (i.e., $M_{FB}$). In some embodiments, additional stages could be added to the circuit under the $V_{REG}$ domain to further boost the AC gain and, therefore, improve noise reduction performance. The level shifter provides a high bandwidth path from $V_{RAW}$ to $V_3$. As $V_3$ tracks $V_{RAW}$, the impact of supply noise associated with $V_{RAW}$ on $V_{REG}$ through the header device is reduced to the first order, thereby reducing supply noise on $V_{REG}$.

Figure 6C:
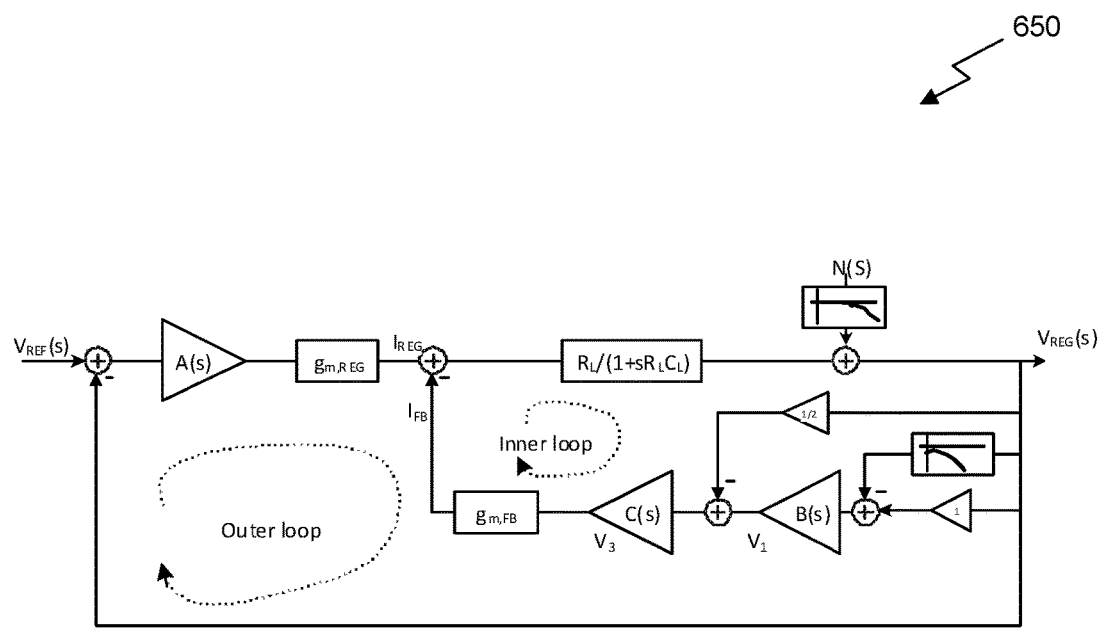
FIG. 6C illustrates a system model of the supply noise compensation circuit, according to one embodiment.

FIG. 6C illustrates a system model 650 of the supply noise compensation circuit 600, according to one embodiment. As illustrated by system model 650, the feedback loop of supply noise compensation circuit 600 effectively adds an inner loop within the existing LDO's outer loop. With the help of the resistive feedback inverter, a subtraction of $V_{REG}(s)$ and a low-passed version of $V_{REG}(s)$ is generated, thereby adding a zero and a pole into the overall system. The added zero and pole are both smaller than the output pole ($P_{L,open} = 1/R_L C_L$). The additional path provided by the inner loop having an attenuation of one half at DC further reduces the zero and increases the peaking, while the pole remains substantially the same. Therefore, for the inner loop, there are one zero and two poles in open loop. With the loop closed, the output pole will be pushed higher while a pole otherwise at $2g_m/C$ will be pushed closer to the zero. Furthermore, by setting the open loop gain greater than 1 between the zero at $1/RC$ and the output pole at $1/R_L C_L$, the inner loop compensates for the supply noise within this bandwidth.

A root locus analysis of system model 650 indicates that for the closed inner loop, as the loop gain $g_{m,FB}$ increases, the feedback path associated the closed loop pole starts from $P_{FB,open}$ and shifts towards $Z_{FB,open}$, while the output associated closed loop pole starts from $P_{L,open}$ and shifts leftwards along the real axis. Consequently, the phase margin of system model 650 converges to 90 degrees as the loop gain increases to infinity, demonstrating the inherent stability of the inner loop.

Figure 7A:
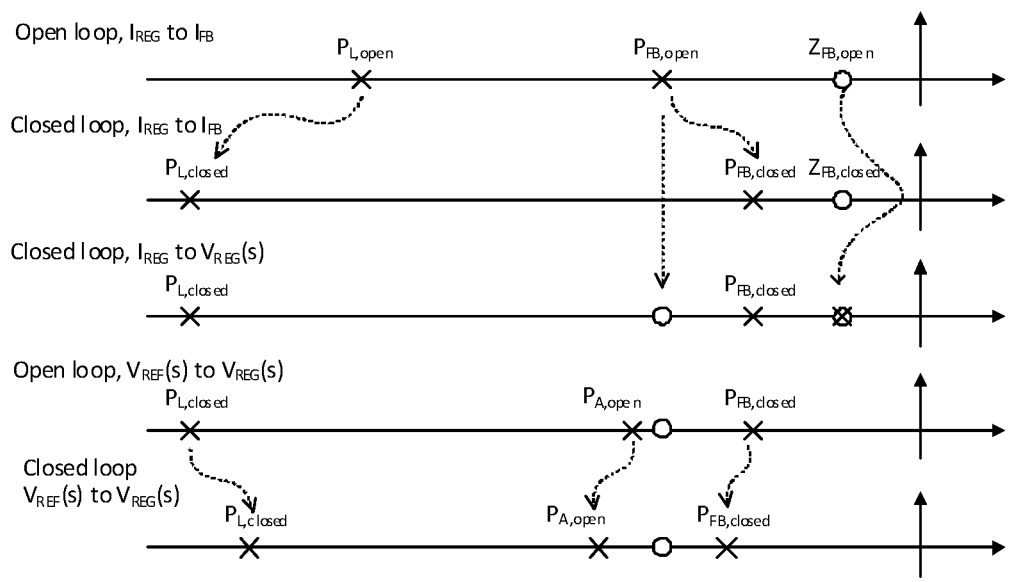
FIG. 7A illustrates a root locus analysis of the system model, according to one embodiment.

FIG. 7A illustrates a root locus analysis of the system model 650, according to one embodiment. This root locus analysis assumes that $P_{FB,open}$ is smaller than $P_{A,open}$, the pole associated with an error amplifier within the LDO regulator circuit. Since the output pole $P_{L,closed}$ is great than $P_{L,open}$, the main loop may have even great phase margin in comparison with designs lacking the inner loop, which is a two pole system having poles $P_{L,open}$ and $P_{A,open}$. If $P_{FB,open}$ is equal to $P_{A,open}$, there are two poles left $P_{L,closed}$ and $P_{FB,closed}$. As they are separated far apart by the inner loop, the system becomes increasingly stabilized. Note that if $P_{FB,open}$ is greater than $P_{A,open}$, then $P_{FB,closed}$ must be far apart from $P_{A,open}$ for stability.

The supply noise compensation circuit 600 of FIG. 6B has been simulated for verification of both function and performance. Significant simulation parameters are given in Table 1. For the open inner loop, the zero is smaller than both of the two poles with separation of approximately 10×. Therefore, the inner loop is stable with loop closed. For the open outer loop, the zero introduced by the inner loop cancels out the pole induced by the regulator's error amplifier (comparator). Hence, there are two poles left with ratio of 300×. As such, the closed loop is stable with a large range of loop gain.

Figure 7B:
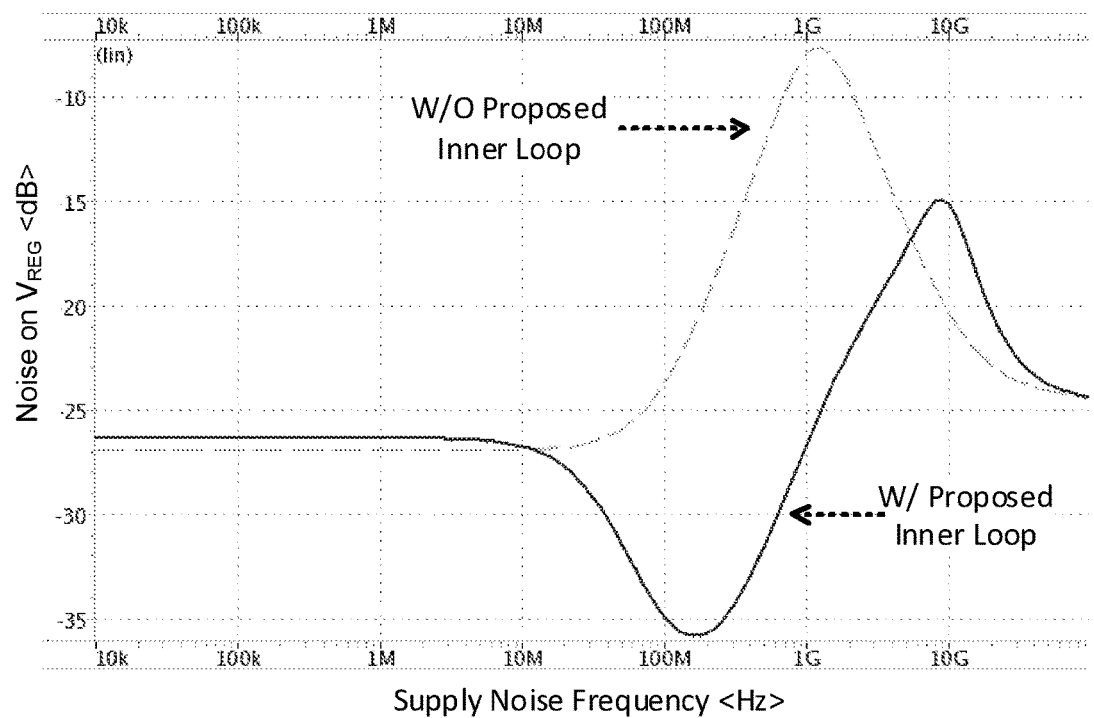
FIG. 7B illustrates regulated supply noise as a function of frequency with and without the supply noise compensation circuit, according to one embodiment.

FIG. 7B illustrates regulated supply noise as a function of frequency with and without the supply noise compensation circuit, according to one embodiment. The regulated supply noise curves shown were generated using an AC simulation model of with and without the inner loop. The inner loop comprises supply noise compensation circuit 600 of FIG. 6B, while the outer loop comprises an LDO regulator circuit. A noise source of amplitude 1 is applied on the unregulated voltage ($V_{RAW}$) and the noise (as a function of frequency) on $V_{REG}$ is shown in as a noise curve on $V_{REG}$. In comparison with the conventional regulator design, including the inner loop improves the noise rejection ratio by 11 dB at 100 MHz, 19 dB at 1 GHz. The rejection ratio deteriorates by 0.6 dB at DC. As the PSRR is over 26 dB at low frequency, the loss of 0.6 dB at DC on PSRR can be tolerated. PSRR deteriorates by 5 dB at 10 GHz due to secondary poles. Since the noise amplitude at high frequency on $V_{RAW}$ is much less in comparison with the low and mid band, the peaking around 10 GHz can also be tolerated.

Figure 7C:
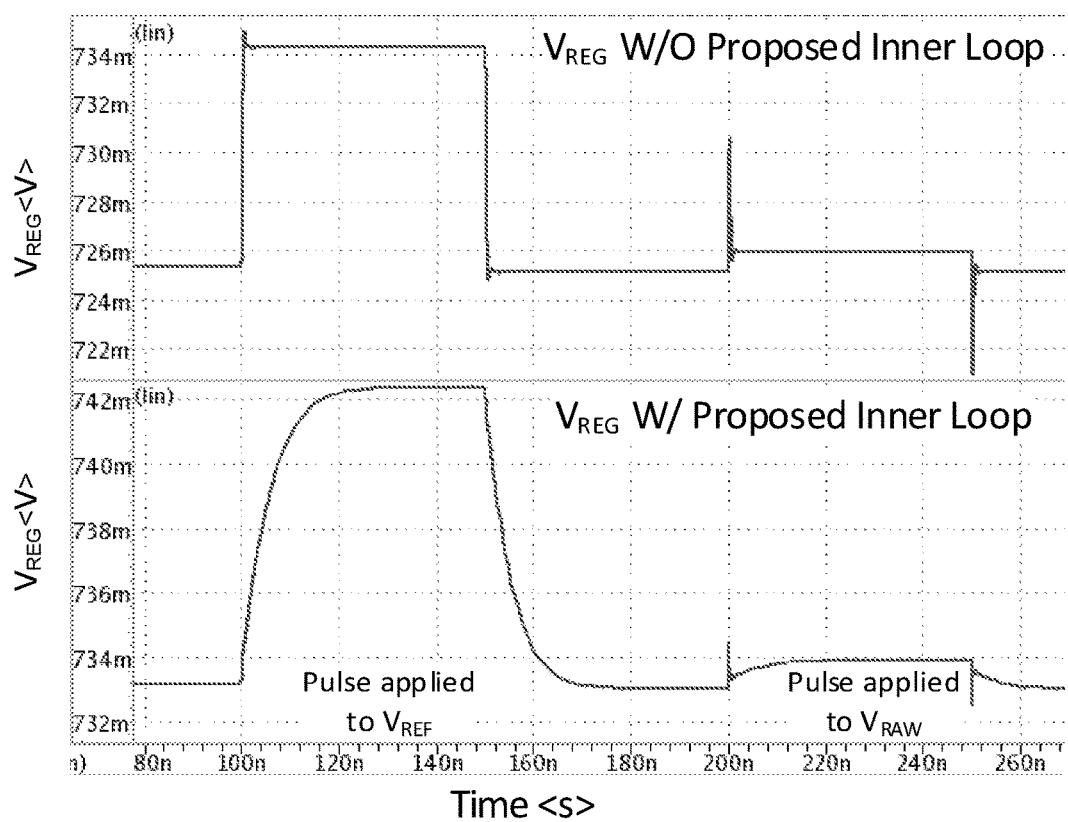
FIG. 7C illustrates regulated supply noise resulting from a transient pulse with and without the supply noise compensation circuit, according to one embodiment.

FIG. 7C illustrates regulated supply noise resulting from a transient pulse with and without the supply noise compensation circuit, according to one embodiment. To verify system stability in the time domain, a transient analysis simulation was performed using two pulses injected into the system through $V_{REF}$ and $V_{RAW}$, respectively. The response on $V_{REG}$ is shown in the two waveforms. The upper waveform illustrates response without the inner loop, while the lower waveform illustrates response with the inner loop (e.g., supply noise compensation circuit 600 of FIG. 6B). The bandwidth from input to the output with the inner loop is actually reduced according to the simulation, which is consistent with the analysis. This improves the phase margin of the regulator loop, making the system more stable. Lower bandwidth leads to longer startup time, which can be bypassed in simulation. The present transient analysis simulation indicates overall stability.

TABLE 1

Parameters for simulation

| | Value |
|---|---|
| $R_{FB}$ <Ω> | 7500 |
| $C_{SH}$ <pF> | 2 |
| $R_L$ <Ω> | 75 |
| $C_L$ <pF> | 2 |
| Inner open loop | |
| $Z_{FB,open}$ <MHz> | 10 |
| $P_{FB,open}$ <MHz> | 100 |
| $P_{L,open}$ <MHz> | 1000 |
| Inner closed loop | |
| $Z_{FB,closed}$ <MHz> | 10 |
| $P_{FB,closed}$ <MHz> | 30 |
| $P_{L,closed}$ <MHz> | 10000 |
| Outer open loop | |
| $P_{FB}$ <MHz> | 30 |
| $Z_{FB}$ <MHz> | 100 |
| $P_{A,open}$ <MHz> | 100 |
| $P_L$ <MHz> | 10000 |

In this simulation, a total load current is 10 mA, while current consumed by the supply noise compensation circuit 600 is 0.3 mA, which represents a 3% power overhead. The supply noise is ±100 mV, most of which is in the 100 MHz to several GHz range; a minimum supply voltage ($V_{MIN}$) is 0.6V; and a nominal operating voltage is 0.7V. Given an implementation of the disclosed techniques that improves supply noise rejection ratio by 12 dB, the supply noise after regulation will be only ±25 mV. Therefore, supply voltage can be advantageously reduced to be 0.625V, corresponding to a 20% power saving. Considering the 3% power overhead introduced by the proposed circuit, the total power reduction will be 17%.

A reference-less feedback based supply noise cancellation technique is disclosed for operation in conjunction with an LDO. The technique compares a regulated voltage with a low-pass version of itself the regulated voltage to extract a noise signal, which is applied to compensate for supply noise through feedback.

An inverter structure with resistive feedback followed by another inverter structure in serial is adopted as a supply noise sensor. These inverter structures maintain a DC gain of 0.5 but a high AC gain. Therefore, this combination of inverter structures can cancel out mid-band supply noise with little disturbance to the DC value.

In one embodiment, the supply of the inverter structures (e.g., supply noise compensation circuit 600) may be different from than the supply of the LDO regulator. The disclosed noise cancellation mechanism does not rely on the correlation of these supplies. However, the stability analysis may be different.

Given that the supply noise compensation circuit 600 and the LDO need not share a common supply node, the two can be on the same die, in the same package, or even just on the same board. In any of these packaging scenarios the disclosed noise collation mechanism remains the same and similar performance is expected.

Supply noise in the GHz frequency range on larger chips is not tightly correlated between regions. In one embodiment, multiple instances of a mid to high frequency supply noise compensation circuit (e.g., supply noise compensation circuit 600) are distributed across an integrated circuit. Each instance is able to compensate for regional supply noise and collectively the instances reduce noise globally.

Exemplary System

Figure 8:
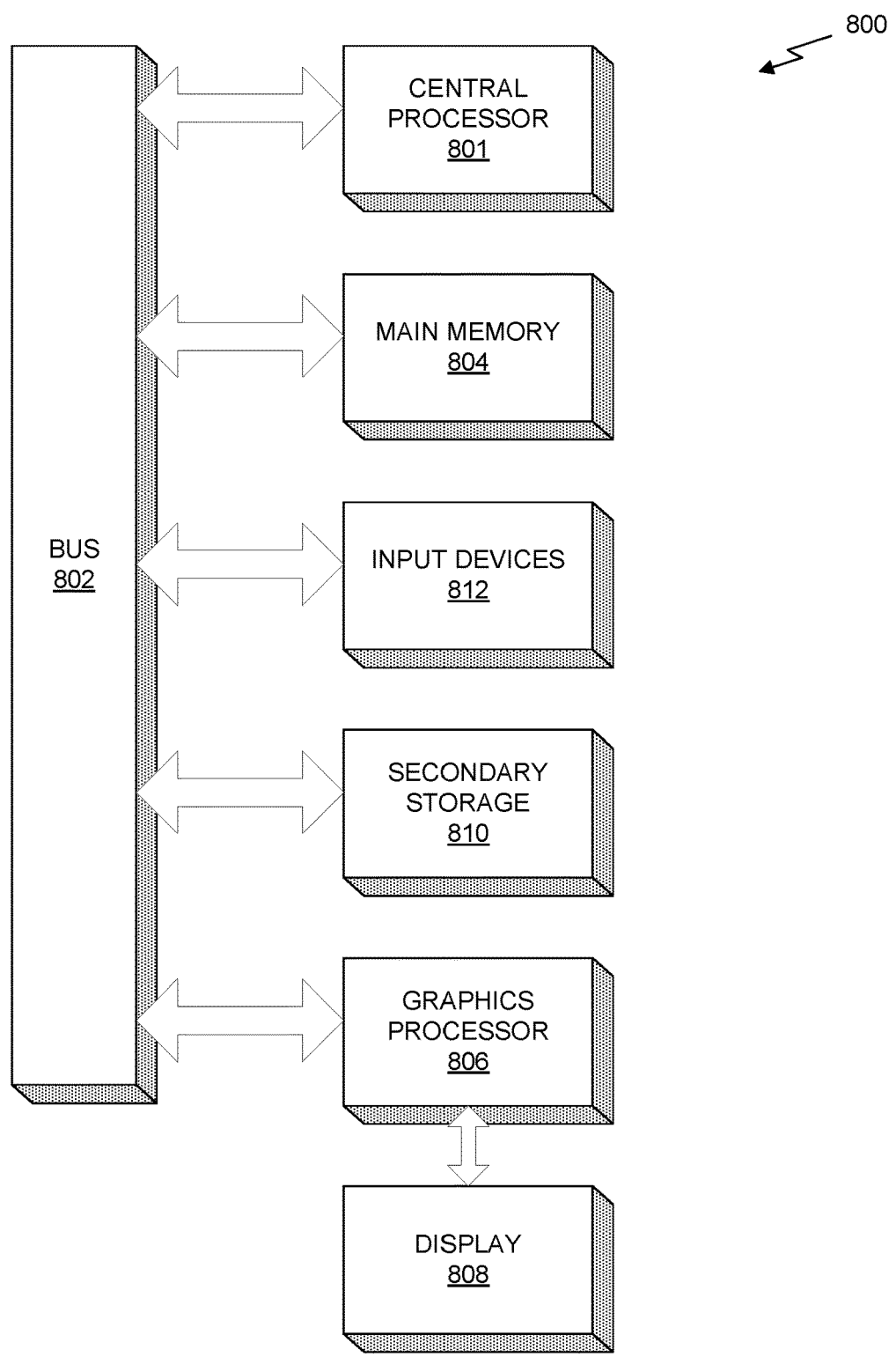
FIG. 8 illustrates an exemplary system in which the various architecture and/or functionality of the various previous embodiments may be implemented.

FIG. 8 illustrates an exemplary system 800 in which the various architecture and/or functionality of the various previous embodiments may be implemented.

As shown, a system 800 is provided including at least one central processor 801 that is connected to a communication bus 802. The communication bus 802 may be implemented using any suitable protocol, such as PCI (Peripheral Component Interconnect), PCI-Express, AGP (Accelerated Graphics Port), HyperTransport, or any other bus or point-to-point communication protocol(s). In one embodiment, the communication bus 802 is the system bus 302 shown in FIG. 3. The system 800 also includes a main memory 804. Control logic (software) and data are stored in the main memory 804 which may take the form of random access memory (RAM).

The system 800 also includes input devices 812, a graphics processor 806, and a display 808, i.e. a conventional CRT (cathode ray tube), LCD (liquid crystal display), LED (light emitting diode), plasma display or the like. User input may be received from the input devices 812, e.g., keyboard, mouse, touchpad, microphone, and the like. In one embodiment, the graphics processor 806 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 800 may also include a secondary storage 810. The secondary storage 810 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 804 and/or the secondary storage 810. Such computer programs, when executed, enable the system 800 to perform various functions. The memory 804, the storage 810, and/or any other storage are possible examples of computer-readable media.

In one embodiment, the architecture and/or functionality of the various previous figures may be implemented in the context of the central processor 801, the graphics processor 806, an integrated circuit (not shown) that is capable of at least a portion of the capabilities of both the central processor 801 and the graphics processor 806, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 800 may take the form of a desktop computer, laptop computer, server, workstation, game consoles, embedded system, and/or any other type of logic. Still yet, the system 800 may take the form of various other devices including, but not limited to a personal digital assistant (PDA) device, a mobile phone device, a television, etc.

Further, while not shown, the system 800 may be coupled to a network (e.g., a telecommunications network, local area network (LAN), wireless network, wide area network (WAN) such as the Internet, peer-to-peer network, cable network, or the like) for communication purposes.

The exemplary system 800 may be configured to include one or more instances of at least one of multi-path receiver circuits 102, 104, 106; (CG) receiver circuit 300; differential common source (CS) receiver 400; differential common source (CS) receiver circuit 500, and/or supply noise compensation circuit 600. For example, graphics processor 806 may include the one or more instances configured to provide chip-to-chip and/or module-to-module communication within the system.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A multi-path circuit comprising:
   a plurality of stages, wherein each stage in the plurality of stages includes at least one metal oxide semiconductor field effect transistor (MOSFET), and wherein an output of each stage in the plurality of stages excluding a final stage in the plurality of stages is coupled to an input of a subsequent stage in the plurality of stages;
   an input signal coupled to the plurality of stages, wherein the input signal is coupled to at least one terminal of a first MOSFET in each stage; and
   an output signal generated by the final stage in the plurality of stages,
   wherein a direct current (DC) gain associated with a node at an output of each stage is constant over each of the nodes at the outputs of the plurality of stages, and wherein an alternating current (AC) gain associated with the node at the output of each stage increases over each of the nodes at the outputs of the plurality of stages based on a number of stages in the plurality of stages that precede the node.

2. The circuit of claim 1, wherein the multi-path circuit comprises a SerDes (Serializer/Deserializer) receiver circuit.

3. The circuit of claim 1, wherein the input signal is coupled to a source terminal of an n-channel MOSFET (NMOS) included in an inverter of each stage in the plurality of stages.

4. The circuit of claim 3, wherein an output of the inverter is coupled to the input of the inverter by a feedback resistor in each odd numbered stage in the plurality of stages.

5. The circuit of claim 1, wherein the input signal comprises a differential signal, wherein a first input signal of the differential signal is coupled to a first subset of stages in the plurality of stages and a second input signal of the differential signal is coupled to a second subset of stages in the plurality of stages, and wherein outputs of corresponding pairs of stages are connected by cross-coupled inverters.

6. The circuit of claim 1, wherein the multi-path circuit comprises a common gate (CG) amplifier.

7. The circuit of claim 6, wherein the CG amplifier includes:
   a first stage having:
      a first n-channel MOSFET (NMOS) having a source terminal coupled to the input signal,
      a feedback resistor coupled between a drain terminal and a gate terminal of the first NMOS, and
      a shunt capacitor coupled between the gate terminal of the first NMOS and a common node; and
   a second stage having:
      a second NMOS having a source terminal coupled to the input signal, a gate terminal coupled to the drain terminal of the first NMOS, and a drain terminal coupled to the output of the CG amplifier.

8. The circuit of claim 1, wherein the multi-path circuit comprises a common source (CS) amplifier.

9. The circuit of claim 8, wherein the CS amplifier includes:
   a first stage having:
      a first n-channel MOSFET (NMOS) having a gate terminal coupled to the input signal; and
   a second stage having:
      a second NMOS having a source terminal coupled to a level-shifted version of the input signal, a gate terminal coupled to a drain terminal of the first NMOS, and a drain terminal coupled to an output of the CS amplifier.

10. The circuit of claim 8, wherein the CS amplifier includes:

a first stage having:
   a first n-channel MOSFET (NMOS) having a gate terminal coupled to the input signal; and
a second stage having:
   a second NMOS having a gate terminal coupled to the input signal and a drain terminal coupled to an output of the CS amplifier, and
   a third NMOS having a gate terminal coupled to a drain terminal of the first NMOS and a drain terminal coupled to the output of the CS amplifier.

11. The circuit of claim 1, wherein the multi-path circuit comprises a noise compensation circuit coupled to a low-dropout (LDO) regulator.

12. The circuit of claim 11, wherein the noise compensation circuit includes:
a first stage having:
   a first inverter having a source terminal of a p-channel MOSFET (PMOS) coupled to the input signal and a source terminal of an n-channel MOSFET (NMOS) coupled to a common node, and wherein the input signal is coupled to a regulated voltage output by the LDO regulator,
   a feedback resistor coupled between an input of the first inverter and the output of the first inverter, and
   a shunt capacitor coupled between the input of the first inverter and the common node;
a second stage having:
   a second inverter having a source terminal of a p-channel MOSFET (PMOS) coupled to the input signal and a source terminal of an n-channel MOSFET (NMOS) coupled to a common node, wherein an output of the first inverter is coupled to an input of the second inverter;
a level-shifter coupled to an output of the second inverter; and
a header device coupled to a load.

13. A system, comprising:
a graphics processing unit fabricated to include a multi-path circuit, the multi-path circuit comprising:
   a plurality of stages, wherein each stage in the plurality of stages includes at least one metal oxide semiconductor field effect transistor (MOSFET), and wherein an output of each stage in the plurality of stages excluding a final stage in the plurality of stages is coupled to an input of a subsequent stage in the plurality of stages;
   an input signal coupled to the plurality of stages, wherein the input signal is coupled to at least one terminal of a first MOSFET in each stage; and
   an output signal generated by the final stage in the plurality of stages,
   wherein a direct current (DC) gain associated with a node at an output of each stage is constant over each of the nodes at the outputs of the plurality of stages, and wherein an alternating current (AC) gain associated with the node at the output of each stage increases over each of the nodes at the outputs of the plurality of stages based on a number of stages in the plurality of stages that precede the node.

14. The system of claim 13, wherein the multi-path circuit comprises a SerDes (Serializer/Deserializer) receiver circuit.

15. The system of claim 13, wherein the input signal is coupled to a source terminal of an n-channel MOSFET (NMOS) included in an inverter of each stage in the plurality of stages.

16. The system of claim 15, wherein an output of the inverter is coupled to the input of the inverter by a feedback resistor in each odd numbered stage in the plurality of stages.

17. The system of claim 13, wherein the multi-path circuit comprises a common source (CS) amplifier.

18. The system of claim 17, wherein the CS amplifier includes:
a first stage having:
   a first n-channel MOSFET (NMOS) having a gate terminal coupled to the input signal; and
a second stage having:
   a second NMOS having a source terminal coupled to a level-shifted version of the input signal, a gate terminal coupled to a drain terminal of the first NMOS, and a drain terminal coupled to an output of the CS amplifier.

19. The system of claim 17, wherein the CS amplifier includes:
a first stage having:
   a first n-channel MOSFET (NMOS) having a gate terminal coupled to the input signal; and
a second stage having:
   a second NMOS having a gate terminal coupled to the input signal and a drain terminal coupled to an output of the CS amplifier, and
   a third NMOS having a gate terminal coupled to a drain terminal of the first NMOS and a drain terminal coupled to the output of the CS amplifier.

20. The system of claim 13, wherein the multi-path circuit comprises a noise compensation circuit coupled to a low-dropout (LDO) regulator, and the noise compensation circuit includes:
a first stage having:
   a first inverter having a source terminal of a p-channel MOSFET (PMOS) coupled to the input signal and a source terminal of an n-channel MOSFET (NMOS) coupled to a common node, and wherein the input signal is coupled to a regulated voltage output by the LDO regulator,
   a feedback resistor coupled between an input of the first inverter and the output of the first inverter, and
   a shunt capacitor coupled between the input of the first inverter and the common node;
a second stage having:
   a second inverter having a source terminal of a p-channel MOSFET (PMOS) coupled to the input signal and a source terminal of an n-channel MOSFET (NMOS) coupled to a common node, wherein an output of the first inverter is coupled to an input of the second inverter;
a level-shifter coupled to an output of the second inverter; and
a header device coupled to a load.

\* \* \* \* \*

UNITED STATES PATENT AND TRADEMARK OFFICE
CERTIFICATE OF CORRECTION

PATENT NO. : 10,298,422 B1  
APPLICATION NO. : 15/862517  
DATED : May 21, 2019  
INVENTOR(S) : Song et al.

Page 1 of 1

It is certified that error appears in the above-identified patent and that said Letters Patent is hereby corrected as shown below:

In the Specification

Column 1 Line 4 Please add the following paragraph before the Field of Invention paragraph:
-- STATEMENT REGARDING FEDERALLY SPONSORED RESEARCH AND DEVELOPMENT
This invention was made with US Government support under LLNS subcontract B609911 and B609487 awarded by DOE. The US Government has certain rights in this invention. --

Signed and Sealed this
Twenty-first Day of July, 2020

Andrei Iancu
*Director of the United States Patent and Trademark Office*